United States Patent [19]
Ooms et al.

[11] Patent Number: 5,923,184
[45] Date of Patent: Jul. 13, 1999

[54] FERROELECTRIC TRANSISTOR LOGIC FUNCTIONS FOR PROGRAMMING

[75] Inventors: William J. Ooms, Chandler; Robert M. Gardner; Jerald A. Hallmark, both of Gilbert; Daniel S. Marshall, Chandler, all of Ariz.

[73] Assignee: Motorola, Inc., Schaumburg, Ill.

[21] Appl. No.: 08/772,744

[22] Filed: Dec. 23, 1996

[51] Int. Cl.$^6$ .................. H03K 19/094; H03K 19/173
[52] U.S. Cl. .................. 326/50; 326/58; 326/121; 326/83
[58] Field of Search .................. 326/82, 83, 37, 326/44, 45, 112, 104, 119, 121, 56, 57, 58, 50

[56] References Cited

U.S. PATENT DOCUMENTS

| | | | |
|---|---|---|---|
| 5,361,224 | 11/1994 | Takasu | 365/145 |
| 5,361,225 | 11/1994 | Ozawa | 365/145 |

*Primary Examiner*—Michael Tokar
*Assistant Examiner*—Daniel D. Chang
*Attorney, Agent, or Firm*—Lanny L. Parker; Rennie William Dover

[57] ABSTRACT

Ferroelectric transistors are combined with MOSFETs to perform logic functions. The logic functions include a non-volatile ferroelectric latch (30), a clocked non-volatile ferroelectric latch (50), a programmable switch (60), an edge-triggered complementary flip-flop (78), a tri-state logic circuit (80), a ferroelectric logic NAND-gate (100), a clocked ferroelectric logic NAND-gate (140), and a programmable logic function (150). The programmable logic function (150) includes a programming terminal (156) to select between a NOR-gate function and a NAND-gate function.

11 Claims, 2 Drawing Sheets

FERROELECTRIC TRANSISTOR LOGIC FUNCTIONS FOR PROGRAMMING

BACKGROUND OF THE INVENTION

The present invention relates, in general, to integrated circuits and, more particularly, to ferroelectric transistor logic functions.

Many logic circuits use Complementary Metal Oxide Semiconductor (CMOS) devices in combinational logic structures. Series and parallel configurations of N-type and P-type CMOS transistors are arranged to form logic structures, such as NAND gates, NOR gates, inverters, multiplexers, etc. These NAND gates, NOR gates, and inverters are the basic logical elements used in forming the more complex functional logic blocks such as multipliers, counters, etc.

Typically, functional logic blocks are designed into integrated circuits to achieve a fixed logical function. Either synchronous or asynchronous functional logic blocks provide logical output signals in accordance with logical input signals. Thus, the selection of a particular set of basic logical elements and the metal interconnect between the basic logical elements provides the fixed logical function.

Accordingly, it would be advantageous to have basic logical elements that can be programmed to provide configurable functional logic blocks. It would be of further advantage to provide an easy method of programming that allows flexibility to reconfigure the logical function provided by the functional logic blocks. Further, it would be advantageous for the basic logical elements to be capable of maintaining a programmed state when power to the logical elements is interrupted.

DETAILED DESCRIPTION OF THE DRAWINGS

Generally, the present invention provides ferroelectric logic gates that are used in integrated circuits for combinational logic. In accordance with one aspect of the present invention, data retention of logic states is maintained by the polarization of a ferrogate material in ferroelectric transistors. Also, a logical function performed by a combination of logic gates is non-volatile and is maintained by the ferroelectric material of the ferroelectric transistors.

In accordance with another aspect of the present invention, a programmable ferroelectric logic function has been provided which is comprised of a plurality of transistors of a first type, e.g., N-channel field effect transistors, and a plurality of transistors of a second type, e.g., P-channel field effect transistors, wherein each of the transistors has a gate electrode, a drain electrode, and a source electrode. Further, at least one of the plurality of N-channel or P-channel transistors is a ferroelectric transistor. To implement a logic function, at least two of the N-channel or at least two P-channel transistors are coupled in one of a series or a parallel configuration. Further, an input terminal is connected to the gate electrode of at least one of the N-channel or the P-channel transistors and an output terminal is connected to the drain of at least one of the N-channel or the P-channel transistors. It should be noted that a transistor coupled in a series configuration has a drain electrode of one transistor connected to a source electrode of another transistor. In addition, a transistor coupled in a parallel configuration has both source and drain electrodes of one transistor connected to the source and drain electrodes, respectively, of another transistor.

It should be noted that ferroelectric devices are also described in U.S. patent application Ser. No. 08/772,735, Attorney's Docket No. CR96-131, entitled "PROGRAMMABLE SWITCH MATRIX AND METHOD OF PROGRAMMING", filed on Dec. 23, 1996, by Gardner et al., and assigned to Motorola, Inc.; U.S. patent application Ser. No. 08/772,736, Attorney's Docket No. CR96-132, entitled "CONFIGURABLE MONOLITHIC SEMICONDUCTOR CIRCUIT AND METHOD FOR CONFIGURING", filed on Dec. 23, 1996, by Gardner et al., and assigned to Motorola, Inc.; U.S. patent application Ser. No. 08/772,743, Attorney's Docket No. CR96-067, entitled "PROGRAMMABLE DISPLAY MATRIX AND METHOD OF PROGRAMMING", filed on Dec. 23, 1996, by Ooms and assigned to Motorola, Inc. The U.S. Patent Applications entitled "PROGRAMMABLE SWITCH MATRIX AND METHOD OF PROGRAMMING" (Attorney Docket No. CR96-131), "CONFIGURABLE MONOLITHIC SEMICONDUCTOR CIRCUIT AND METHOD FOR CONFIGURING" (Attorney Docket No. CR96-132), and "PROGRAMMABLE DISPLAY MATRIX AND METHOD OF PROGRAMMING" (Attorney Docket No. CR96-067) are hereby incorporated herein by reference.

Figure 1:
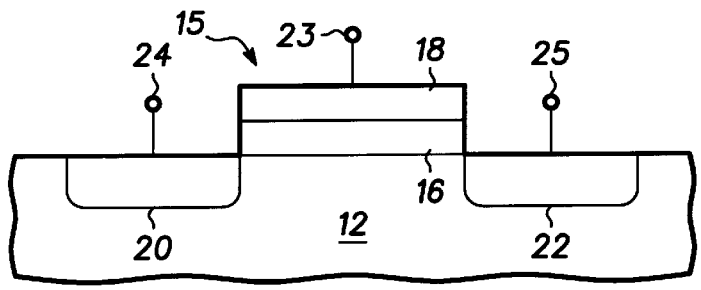
FIG. 1 is a cross sectional view of a ferroelectric programmable transistor.

FIG. 1 is a cross sectional view of a ferroelectric programmable transistor 10. Ferroelectric transistor 10 is a Field Effect Transistor (FET) structure comprised of a semiconductor material 12 having a gate structure 15 formed thereon. In accordance with the present invention, gate structure 15 is comprised of a ferroelectric material 16 and a conductive or gate material 18, wherein ferroelectric material 16 is grown on semiconductor material 12. Ferroelectric material 16 serves as a gate dielectric material of ferroelectric transistor 10. In addition, ferroelectric transistor 10 has source and drain regions 20 and 22, respectively. A gate terminal 23 contacts gate material 18, a source terminal 24 contacts source region 20, and a drain terminal 25 contacts drain region 22.

Ferroelectric transistors are also referred to as ferroelectric semiconductor devices, ferrogate devices, or ferrogate transistors. It should be noted that gate terminal 23 serves as a control electrode and the source and drain terminals 24 and 25, respectively, serve as current carrying electrodes. The ferroelectric transistor can be either an N-channel FET structure or a P-channel FET structure as determined by the type of impurities within source region 20, drain region 22, and substrate 12.

The threshold voltage, $V_{TH}$, for a non-ferroelectric Metal Oxide Semiconductor Field Effect Transistor (MOSFET) device is determined by the semiconductor material, the type of gate material, the impurities and fixed charge at the interface between the gate dielectric material and the semiconductor material, the doping concentration of the bulk region of the semiconductor material, and the composition and dimensions of the gate dielectric. In addition, threshold voltage $V_{TH}$, is dependent on the voltage potential between a source terminal and a bulk terminal. This dependence is commonly referred to as the body effect.

Ferroelectric material 16 of the ferroelectric transistor introduces a shift in the carrier concentration of a current conduction channel formed between the source and drain regions that affects the threshold voltage, $V_{TH}$. The remnant polarization of ferroelectric material 16 shifts the threshold voltage, $V_{TH}$, between one of two stable states. For a high programming voltage, the gate-to-channel voltage provides a positive field across ferroelectric material 16 greater than the coercive field which provides for switching of ferroelectric material 16. For a low programming voltage, the gate-to-channel voltage provides a negative field across ferroelectric material 16 which exceeds the negative coercive field which provides for switching of ferroelectric material 16. When a high programming voltage supplied to gate material 18, ferroelectric material 16 becomes polarized in an up-polarization state. The voltage causing ferroelectric material 16 to become polarized in the up-polarization state is referred to as a polarizing voltage. When a voltage supplied to gate material 18 is at or below a low programming, ferroelectric material 16 becomes polarized in a down-polarization state. The voltage causing ferroelectric material 16 to become polarized in the down-polarization state is referred to as a depolarizing voltage. It should also be noted that ferroelectric material 16 can be polarized in an up or down polarization state by providing a programming voltage at a substrate terminal (not shown) of ferroelectric programmable transistor 10.

It should be noted that the operating range of logic devices is in a range of about zero volts to about VDD, where VDD is the supply voltage. A high programming voltage applied to gate terminal 23 of ferroelectric programmable transistor 10 is outside the logic operating range. In addition, a low programming voltage applied to gate terminal 23 of ferroelectric programmable transistor 10 is outside the logic operating range.

The threshold voltages for ferroelectric programmable transistor 10 can be set so that signals with voltage values between the polarizing voltage and the depolarizing voltage do not cause ferroelectric programmable transistor 10 to change state. Ferroelectric programmable transistor 10 programmed to be in an up-polarization state has a threshold voltage that is shifted below a low programming voltage. Ferroelectric programmable transistor 10 programmed to be in a down-polarization state has a threshold voltage that is shifted above a high programming voltage. Thus, the voltage at which ferroelectric programmable transistor 10 is programmed is outside the logic operating range. Ferroelectric programmable transistor 10 does not respond to input signals within the logic operating range at gate terminal 23.

The up and down polarization states of the ferroelectric material shift the two threshold voltage values for ferroelectric transistor 10. Thus, the threshold voltages for ferroelectric programmable transistor 10 can be set such that either an up-polarization or a down-polarization state shifts the threshold value to be within the logic operating range. Ferroelectric programmable transistor 10 responds to input signals within the logic operating range at gate terminal 23.

By way of example, a high programming voltage applied to gate terminal 23 of ferroelectric programmable transistor 10 programs the up-polarization state. The threshold voltages for ferroelectric programmable transistor 10 can be set such that ferroelectric programmable transistor 10 is always "on" or in the conduction mode when programmed in the up-polarization state. The threshold voltage for ferroelectric programmable transistor 10 is shifted such that ferroelectric programmable transistor 10 functions as a depletion mode device when in the up-polarization state. A low programming voltage applied to gate terminal 23 of ferroelectric programmable transistor 10 programs the down-polarization state. The threshold voltages for ferroelectric programmable transistor 10 can be set such that ferroelectric programmable transistor 10 responds to signals with voltage levels within the logic operating range. Ferroelectric programmable transistor 10 acts as an enhancement mode device in the logic operating range.

In another example, the threshold voltages of ferroelectric programmable transistor 10 can be set such that ferroelectric programmable transistor 10 is always "off" or in the nonconducting mode when programmed in the down-polarization state. Ferroelectric programmable transistor 10 is programmed to be in the down-polarization state with a low programming voltage applied to gate terminal 23. An up-polarization state is programmed with a high programming voltage applied to gate terminal 23 of ferroelectric programmable transistor 10. The up-polarization state shifts the threshold voltage of ferroelectric programmable transistor 10 such that the transistor responds to signals with voltage levels within the logic operating range.

In yet another example, the threshold voltages of ferroelectric programmable transistor 10 can be set such that the transistor is programmed to be in the down-polarization state with a low programming voltage and in the up-polarization state with a high programming voltage. In either the up-polarization state or the down-polarization state the threshold voltages are shifted to be within the logic operating range. Thus, the level of conductivity of ferroelectric programmable transistor 10 is set by the logic value of the logic signal applied to gate terminal 23.

It should be noted that the programming of ferroelectric programmable transistor 10 has been described with reference to an N-channel device. For an N-channel ferroelectric programmable transistor 10, current conduction is enhanced in the up-polarization state. Similarly, a P-channel ferroelectric programmable transistor has current conduction enhanced in the up-polarization state. In the previously cited examples for applying programming voltages for an N-channel ferroelectric programmable transistor 10, a description of a P-channel ferroelectric programmable transistor requires replacing references to an up-polarization state being programmed by a high programming voltage with a reference to a low programming voltage. Similarly, the programming of a P-channel ferroelectric programmable transistor requires replacing references to a down-polarization state being programmed by a low programming voltage with a reference to a high programming voltage.

Figure 2:
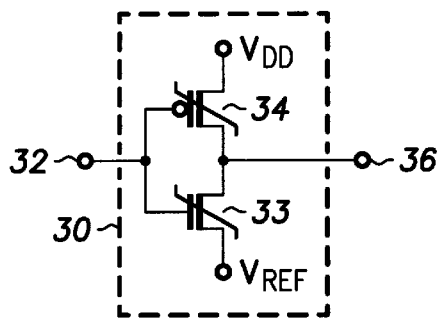
FIG. 2 is a schematic diagram of a non-volatile ferroelectric latch in accordance with a first embodiment of the present invention.

FIG. 2 is a schematic diagram of a non-volatile ferroelectric latch in accordance with a first embodiment of the present invention. More particularly, ferroelectric latch 30 is comprised of an N-channel ferroelectric transistor 33 and a P-channel ferroelectric transistor 34. A source terminal of ferroelectric transistor 34 serves as a bias terminal and is connected to a first source of operating potential such as, for example, a supply voltage $V_{DD}$. A drain terminal of ferroelectric transistor 34 is connected to a drain terminal of ferroelectric transistor 33 to form an output terminal 36. Output terminal 36 is also referred to as a ferroelectric inverter output. A source terminal of ferroelectric transistor 33 is connected to a second source of operating potential such as, for example, a voltage $V_{REF}$. By way of example, voltage $V_{REF}$ is a ground potential. A gate terminal of ferroelectric transistor 34 is commonly connected to a gate terminal of ferroelectric transistor 33 to form an input terminal 32. It should be noted that input terminal 32 is a ferroelectric inverter input serving as a programming terminal for ferroelectric latch 30.

In operation, non-volatile ferroelectric latch 30 is programmed by supplying a high programming voltage or a low programming voltage to input terminal 32. A high programming voltage is a polarizing voltage of N-channel ferroelectric transistor 33 and a depolarizing voltage of P-channel ferroelectric transistor 34. On the other hand, a low programming voltage is a depolarizing voltage of N-channel ferroelectric transistor 33 and a polarizing voltage of P-channel ferroelectric transistor 34. The threshold voltages for ferroelectric transistors 33 and 34 can be set so that N-channel ferroelectric transistor 33 and P-channel ferroelectric transistor 34 operate as an inverter whose input is responsive to input signals in the logic operating range. Alternatively, threshold voltages for ferroelectric transistors 33 and 34 can be set so that N-channel ferroelectric transistor 33 and P-channel ferroelectric transistor 34 can be programmed to not respond to input signals in the logic operating range. A polarizing voltage at input 32 for N-channel ferroelectric transistor 33 causes ferroelectric transistor 33 to be in the conductive mode while P-channel ferroelectric transistor 34 is in the nonconductive mode, causing the inverter output to be driven to about $V_{REF}$. A depolarizing voltage at input 32 for N-channel ferroelectric transistor 33 causes ferroelectric transistor 33 to be in the nonconductive mode while P-channel ferroelectric transistor 34 is in the conductive mode, causing the inverter output to be driven to about VDD.

Figure 3:
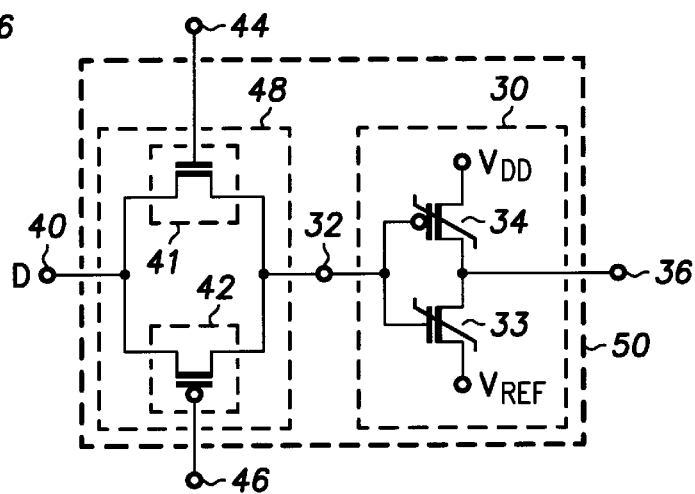
FIG. 3 is a schematic diagram of a clocked non-volatile ferroelectric latch in accordance with a second embodiment of the present invention.

FIG. 3 is a schematic diagram of a clocked non-volatile ferroelectric latch 50 in accordance with a second embodiment of the present invention. More particularly, ferroelectric latch 50 includes a transmission gate 48 connected to ferroelectric latch 30 (FIG. 2). It should be noted that the same reference numbers are used in the figures to denote the same elements. Clocked non-volatile ferroelectric latch 50 has a data input terminal 40, an output terminal 36, a control terminal 44, and a complementary control terminal 46. In addition, transmission gate 48 has an N-channel MOSFET 41 with the gate terminal connected to control terminal 44 and a P-channel MOSFET 42 with the control electrode connected to complementary control terminal 46. Typically, control terminal 44 is coupled for receiving a clock signal CLK and complementary control terminal 46 is coupled for receiving a complementary clock signal CLKB. Commonly connected drain terminals of MOSFETs 41 and 42 of transmission gate 48 serve as the data input terminal 40 of ferroelectric latch 50. The commonly connected source terminals of MOSFETs 41 and 42 of transmission gate 48 serve as the output terminal of transmission gate 48. The output terminal of transmission gate 48 is connected to input terminal 32 of ferroelectric latch 30. Alternatively, N-channel MOSFET 41 and P-channel MOSFET 42 of transmission gate 48 can be N-channel and P-channel ferroelectric transistors, respectively, that form a ferroelectric transmission gate.

In operation, clocked ferroelectric latch 50 latches the data received at data input terminal 40 when a signal CLK at control terminal 44 transitions from a logic one to a logic zero and a signal CLKB at complementary control terminal 46 transitions from a logic zero to a logic one. A logic one value at data input terminal 40, a logic one value for the signal CLK, and a logic zero value for the signal CLKB causes output terminal 36 to have a logic zero value. A logic zero value at data input terminal 40, a logic one value for the signal CLK, and a logic zero value for the signal CLKB causes output terminal 36 to have a logic one value. When the signal CLK is at a logic zero value and the signal CLKB is at a logic one value, output terminal 36 retains the logic value for the last programmed state and does not respond to the logic value received at data input terminal 40.

Figure 4:
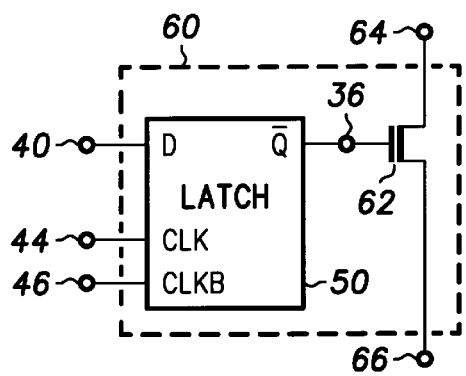
FIG. 4 is a schematic diagram of a programmable switch in accordance with a third embodiment of the present invention.

FIG. 4 is a schematic diagram of a non-volatile programmable switch 60 in accordance with a third embodiment of the present invention. Non-volatile programmable switch 60 has a data input terminal 40, control terminal 44, complementary control terminal 46, and output terminals 64 and 66. It should be noted that the same reference numbers are used in the figures to denote the same elements. More particularly, non-volatile programmable switch 60 includes a clocked non-volatile ferroelectric latch 50 (FIG. 3) connected to a pass-gate switch 62. By way of example, pass-gate switch 62 is a field effect transistor having a gate terminal, a source terminal, and a drain terminal. Thus, output terminal 36 of ferroelectric latch 50 is connected to the gate of pass-gate switch 62. The source and drain terminals of pass-gate switch 62 serve as output terminals 64 and 66, respectively, of non-volatile programmable switch 60. Pass-gate switch 62 is bi-directional in that the source and drain terminals are interchangeable.

In operation, non-volatile programmable switch 60 receives data at data input terminal 40, and the complementary clock signals CLK and CLKB at the respective complementary control terminals 44 and 46. In response to the data and complementary clock signals, non-volatile programmable switch 60 conducts a current between output terminals 64 and 66 when a logic value that enables pass-gate switch 62 is latched at output terminal 36 of ferroelectric latch 50. By way of example, a logic one value enables an N-type pass-gate switch 62 and a logic zero value causes pass-gate switch 62 to be open or nonconductive. It should be noted that pass-gate switch 62 is bi-directional in that current can flow from source-to-drain or drain-to-source. It should be further noted that a P-type pass-gate switch 62 is enabled when a logic zero value is latched at output terminal 36. Non-volatile programmable switch 60 can be used in a variety of applications, including a programmable switch in a Field Programmable Gate Array (FPGA).

Figure 5:
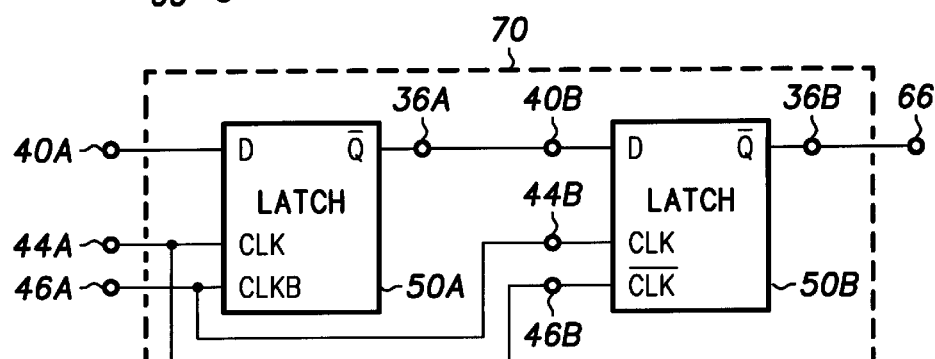
FIG. 5 is a schematic diagram of a non-volatile edge-triggered complementary flip-flop in accordance with a fourth embodiment of the present invention.

FIG. 5 is a schematic diagram of a non-volatile edge-triggered complementary flip-flop 70 in accordance with a fourth embodiment of the present invention. Non-volatile edge-triggered complementary flip-flop 70 has a data input terminal 40A and complementary clock terminals 44A and 46A and an output terminal 36B. More particularly, flip-flop 70 is comprised of two ferroelectric latches 50A and 50B, wherein the internal structure of ferroelectric latches 50A and 50B are the same as that of ferroelectric latch 50. It should be understood that the letters "A" and "B" have been appended to reference number 50 to indicate that latches 50A and 50B are preferably the same as latch 50.

Ferroelectric latches 50A and 50B are coupled in a master/slave configuration. Thus, an output terminal 36A of ferroelectric latch 50A is connected to the data input terminal 40B of ferroelectric latch 50B. Further, control terminal 44A of ferroelectric latch 50A is coupled to the complementary control terminal 46B of ferroelectric latch 50B. Moreover, complementary control terminal 46A of ferroelectric latch 50A is connected to control terminal 44B of ferroelectric latch 50B. Thus, clocked ferroelectric latch 50A serves as the master portion and clocked ferroelectric latch 50B serves as the slave portion of the master/slave configuration. An output terminal 36B of clocked ferroelectric latch 50B serves as output terminal 66 of flip-flop 70.

In operation, edge-triggered complementary flip-flop 70 receives a signal at data input terminal 40A. A logic one signal received at clock terminal 44A and a logic zero signal received at complementary clock terminal 46A causes the complement of the signal received at data input terminal 40A to appear at the output of the master portion of flip-flop 70, i.e., at terminal 36A. A transition of the logic one value to a logic zero value at clock terminal 44A and a transition of the logic zero value to a logic one value at complementary clock terminal 46A causes the master portion of flip-flop 70 to latch the complement of the signal received at data input terminal 40A. When a logic zero value signal is received at clock terminal 44A and a logic one value signal is received at complementary clock terminal 46A, the output of the master portion of flip-flop 70 does not respond to changes in the logic value received at data input terminal 40A.

With the logic zero value signal received at clock terminal 44B and the logic one value signal received at complementary clock terminal 46B, the slave portion of flip-flop 70 responds to the latched data stored in the master portion. The logic value at output terminal 36B is a complement of the logic value latched in the master portion of flip-flop 70. When the signal at clock terminal 44B transitions to a logic one value and the signal at complementary clock terminal 46B transitions to a logic zero value, the slave portion of flip-flop 70 latches the complement of the logic value latched in the master portion of flip-flop 70. Flip-flop 70 can be configured to operate as a binary divide-by-two frequency divider or as a master/slave shift register.

Figure 6:
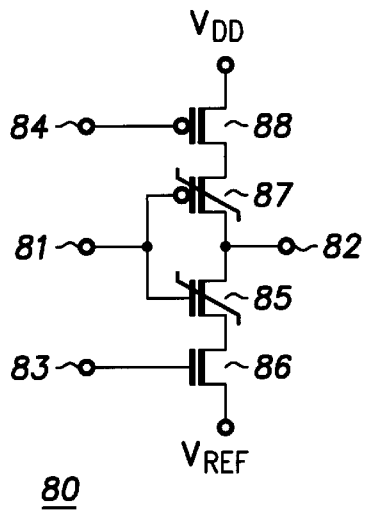
FIG. 6 is a schematic diagram of a tri-state logic circuit in accordance with a fifth embodiment of the present invention.

FIG. 6 is a schematic diagram of a tri-state logic circuit 80 in accordance with a fifth embodiment of the present invention. Tri-state logic circuit 80 has a data input terminal 81 and complementary enable input terminals 83 and 84, and an output terminal 82. A gate terminal of N-channel MOSFET 86 serves as enable input terminal 83. Commonly connected gate terminals of N-channel ferroelectric transistor 85 and P-channel ferroelectric transistor 87 form data input terminal 81. A gate terminal of P-channel MOSFET 88 serves as a complementary enable input terminal 84. P-channel MOSFET 88, P-channel ferroelectric transistor 87, N-channel ferroelectric transistor 85, and N-channel MOSFET 86 are serially connected. More particularly, N-channel ferroelectric transistor 85 and P-channel ferroelectric transistor 87 have commonly connected drain terminals that form output terminal 82. A source terminal of N-channel ferroelectric transistor 85 is connected to a drain terminal of N-channel MOSFET 86. A source terminal of N-channel MOSFET 86 serves as a bias terminal and is connected to a second source of operating potential such as, for example, a voltage $V_{REF}$. By way of example, voltage $V_{REF}$ is a ground potential. A source terminal of P-channel ferroelectric transistor 87 is connected to a drain terminal of P-channel MOSFET 88. A source terminal of P-channel MOSFET 88 serves as a bias terminal and is connected to a first source of operating potential such as, for example, a voltage $V_{DD}$.

In operation, tri-state logic circuit 80 receives an enable signal at enable input terminal 83 and a complementary enable signal at complementary enable input terminal 84. With a logic one value for the enable signal and a logic zero value at complementary enable input terminal 84, a complement of the data signal received at data input terminal 81 appears at output terminal 82. A data signal having a logic one value is a polarizing voltage of N-channel ferroelectric transistor 85 and a depolarizing voltage of P-channel ferroelectric transistor 87. When N-channel ferroelectric transistor 85 is polarized and P-channel ferroelectric transistor 87 is depolarized, ferroelectric transistor 85 is in an "on-state" and conductive, while ferroelectric transistor 87 is in an "off-state" and nonconductive. On the other hand, a logic zero value for the data signal is a depolarizing voltage of N-channel ferroelectric transistor 85 and a polarizing voltage of P-channel ferroelectric transistor 87. When P-channel ferroelectric transistor 87 is polarized and N-channel ferroelectric transistor 85 is depolarized, ferroelectric transistor 87 is in an "on-state" and conductive, while ferroelectric transistor 85 is in an "off-state" and nonconductive.

With the enable signal at a logic zero value, the polarized and depolarized states of ferroelectric transistors 85 and 87 are not affected by a change in the input signal received at data input terminal 81. Thus, the output signal at output terminal 82 is unchanged. When the enable signal is at a logic one value and the input data signal received at data input terminal 81 has a voltage value between the polarizing voltage and depolarizing voltage, ferroelectric transistors 85 and 87 do not change state. For example, the input data signal has a voltage value between the polarizing voltage and depolarizing voltage when the input is driven by either a tri-state bus driver or a transmission gate that is in an "off-state".

Figure 7:
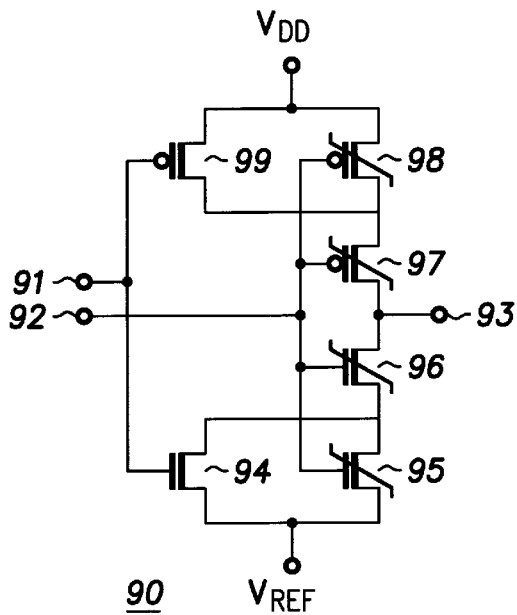
FIG. 7 is a schematic diagram of a ferroelectric logic structure in accordance with a sixth embodiment of the present invention.

FIG. 7 is a schematic diagram of a ferroelectric logic structure 90 in accordance with a sixth embodiment of the present invention. Ferroelectric logic structure 90 can be programmed to implement a NAND or NOR function and has logic input terminals 91 and 92, and an output terminal 93. Input terminal 92 also serves as a programming input terminal and receives programming voltages outside the operating logic range for configuring the ferroelectric transistors. The source terminals of transistor 94 and ferroelectric transistor 95 are commonly connected and serve as a bias terminal and in addition are connected to a first source of operating potential such as, for example, a voltage $V_{REF}$. By way of example, $V_{REF}$ is ground potential. The commonly connected drain terminals of transistor 94 and ferroelectric transistor 95 are connected to the source terminal of N-channel ferroelectric transistor 96. The commonly connected drain terminals of P-channel ferroelectric transistor 97 and ferroelectric transistor 96 serve as logic output terminal 93. The commonly connected drain terminals of P-channel ferroelectric transistor 98 and P-channel transistor 99 are connected to the source terminal of ferroelectric transistor 97. The commonly connected source terminals of ferroelectric transistor 98 and transistor 99 serve as a bias terminal and are connected to a second source of operating potential such as, for example, a supply voltage $V_{DD}$. Ferroelectric transistors 95, 96, 97, and 98 have commonly connected gate terminals that form logic input terminal 92. Transistors 94 and 99 have commonly connected gate terminals that form logic input terminal 91. Although the commonly connected drain terminals of ferroelectric transistors 98 and 99 are coupled to the commonly connected drain terminals of ferroelectric transistors 94 and 95 via ferroelectric transistors 96 and 97, it should be understood this is not a limitation of the present invention. For example, the drain terminals of ferroelectric transistors 94 and 95 can be commonly connected to the drain terminals of ferroelectric transistors 97 and 98.

The threshold voltages set for N-channel ferroelectric transistor 95 cause the down-polarization state to be programmed with a low programming voltage value which results in ferroelectric transistor 95 being "off". The up-polarization state is programmed with a high programming voltage. An up-polarization state shifts the threshold value to be within the logic swing voltage range of logic signals. N-channel ferroelectric transistor 95 is operating as an enhancement device. The threshold voltages set for P-channel ferroelectric transistor 98 cause the down-polarization state to be programmed with a high programming voltage which results in ferroelectric transistor 98 being "off". The up-polarization state is programmed with a low programming voltage. An up-polarization state shifts the threshold value to be within the logic swing voltage range of logic signals. P-channel ferroelectric transistor 98 is operating as an enhancement device.

The threshold voltages set for N-channel ferroelectric transistor 96 cause an up-polarization state to be programmed with a high programming voltage which results in ferroelectric transistor 96 being "on" and in the conduction mode. The threshold voltage of ferroelectric transistor 96 is shifted such that the threshold voltage of ferroelectric transistor 96 is below a logic zero value. A down-polarization state programmed with a low programming voltage shifts the threshold value to be within the logic operating range. The threshold voltage for ferroelectric transistor 96 is shifted such that ferroelectric transistor 96 is an enhancement mode device. The threshold voltages set of P-channel ferroelectric transistor 97 cause an up-polarization state to be programmed with a low programming voltage which results in ferroelectric transistor 97 being always "on". A down-polarization state programmed with a high programming voltage shifts the threshold value to be within the logic operating range. The threshold voltage for ferroelectric transistor 97 is shifted such that ferroelectric transistor 97 is an enhancement mode device.

In operation, a low programming voltage value on logic input terminal 92 programs ferroelectric transistors 95 and 96 to be in the down-polarization state and ferroelectric transistors 97 and 98 to be in the up-polarization state. When N-channel ferroelectric transistor 95 is programmed to be in the down-polarization state and is non-conducting or "off", P-channel ferroelectric transistor 98 is programmed to be in the up-polarization state and responds to logic inputs. However, when N-channel ferroelectric transistor 96 is programmed to be in the down-polarization state and responds to logic inputs, P-channel ferroelectric transistor 97 is programmed to be in the up-polarization state and is "on" or in the conduction mode. The low programming voltage on logic input terminal 92 is removed and the program states for ferroelectric transistors 95, 96, 97, and 98 is retained. Logic input values ranging from about zero volts to about VDD are supplied to logic input terminals 91 and 92. A programmable NAND structure is described with N-channel ferroelectric transistor 95 in a non-conducting mode, P-channel ferroelectric transistor 97 in a conducting mode, ferroelectric transistors 95 and 98 responding to logic values at logic input terminal 92, and transistors 94 and 99 responding to logic values at logic input terminal 91.

A high programming voltage value on logic input terminal 92 programs ferroelectric transistors 95 and 96 to be in the up-polarization state and ferroelectric transistors 97 and 98 to be in the down-polarization state. N-channel ferroelectric transistor 95 programmed to be in the up-polarization state is responsive to a logic input and P-channel ferroelectric transistor 98 programmed to be in the down-polarization state is "off". However, N-channel ferroelectric transistor 96 programmed to be in the up-polarization state is "on" and P-channel ferroelectric transistor 97 programmed to be in the down-polarization state responds to a logic input. The high programming voltage on logic input terminal 92 is removed and the program states for ferroelectric transistors 95, 96, 97, and 98 is retained. Logic input values ranging from about zero volts to about VDD are supplied to logic input terminals 91 and 92. A programmable NOR structure is described with ferroelectric transistors 95 and 97 responding to logic values at logic input terminal 92, transistors 94 and 99 responding to logic values at logic input terminal 91, ferroelectric transistor 96 in a conduction mode, and ferroelectric transistor 98 in a non-conduction mode.

Figure 8:
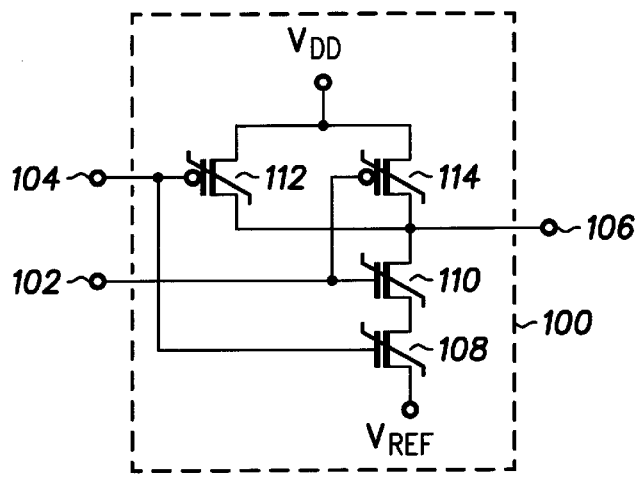
FIG. 8 is a schematic diagram of a ferroelectric logic NAND-gate in accordance with a seventh embodiment of the present invention.

FIG. 8 is a schematic diagram of a ferroelectric logic NAND-gate 100 in accordance with a seventh embodiment of the present invention. Ferroelectric logic NAND-gate 100 has logic input terminals 102 and 104, and an output terminal 106. Ferroelectric logic NAND-gate 100 has two serially connected N-channel transistors 108 and 110 and two parallel connected P-channel transistors 112 and 114. Ferroelectric transistors 108 and 112 have commonly connected gate terminals that form logic input terminal 104. Ferroelectric transistors 110 and 114 have commonly connected gate terminals that form logic input terminal 102. The drain terminals of P-channel ferroelectric transistors 112 and 114 and N-channel ferroelectric transistor 110 are commonly connected and serve as logic output terminal 106. The source terminals of ferroelectric transistors 112 and 114 are commonly connected and serve as a bias terminal and are connected to a first source of operating potential such as, for example, a supply voltage $V_{DD}$. The source terminal for ferroelectric transistor 108 serves as a bias terminal and is connected to a second source of operating potential such as, for example, a voltage $V_{REF}$. By way of example, voltage $V_{REF}$ is a ground potential.

A ferroelectric logic NAND structure has been described having two serially connected N-channel ferroelectric transistors and two parallel connected P-channel ferroelectric transistors. It should be noted that a ferroelectric logic NOR structure has two serially connected P-channel ferroelectric transistors and two parallel connected N-channel ferroelectric transistors. For the ferroelectric logic NOR structure, the N-channel ferroelectric transistors are coupled between an output terminal and $V_{REF}$ potential, while the P-channel ferroelectric transistors are coupled between an output terminal and a $V_{DD}$ potential.

In operation, ferroelectric logic NAND-gate 100 has a logic zero value at logic output terminal 106 when logic one values are received at both logic input terminals 102 and 104. Logic values of 00, 01, or 10 received at logic input terminals 102 and 104, respectively, cause ferroelectric logic NAND-gate 100 to have a logic one value at logic output terminal 106. It should be noted that a "0" is a logic zero value and a "1" is a logic one value. A logic one value for the data signal at logic input terminal 102 is a polarizing voltage of N-channel ferroelectric transistor 108 and a depolarizing voltage of P-channel ferroelectric transistor 112. A logic zero value for the data signal is a depolarizing voltage of N-channel ferroelectric transistor 108 and a polarizing voltage of P-channel ferroelectric transistor 112. Similarly, a logic one value for the data signal at logic input terminal 104 is a polarizing voltage of N-channel ferroelectric transistor 110 and a depolarizing voltage of P-channel ferroelectric transistor 114. A logic zero value for the data signal is a depolarizing voltage of N-channel ferroelectric transistor 110 and a polarizing voltage of P-channel ferroelectric transistor 114. Polarized ferroelectric transistors are considered to be in the "on-state" or conductive state and depolarized ferroelectric transistors are considered to be in the "off-state" or nonconductive state.

Figure 9:
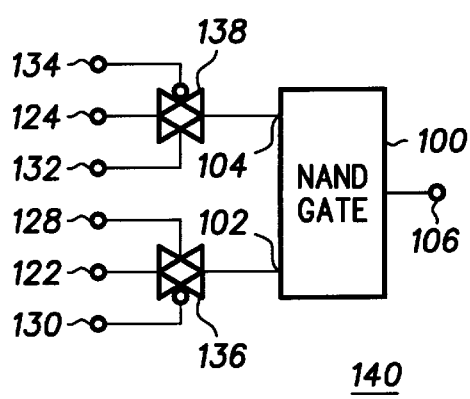
FIG. 9 is a schematic diagram of a clocked ferroelectric logic NAND-gate in accordance with a eighth embodiment of the present invention.

FIG. 9 is a schematic diagram of a clocked ferroelectric logic NAND-gate 140 in accordance with a eighth embodiment of the present invention. Clocked ferroelectric logic NAND-gate 140 has a data input terminal 122, complementary control terminals 128 and 130, a data input terminal 124, complementary control terminals 132 and 134, and an output terminal 106. Clocked ferroelectric logic NAND-gate 140 includes transmission gates 136 and 138 connected to logic input terminals 102 and 104 (FIG. 8), respectively, of NAND-gate 100. It should be noted that the same reference numbers are used in the figures to denote the same elements. An input of transmission gate 136 serves as data input terminal 122 of clocked ferroelectric logic NAND-gate 140 and an output terminal of transmission gate 136 is connected to logic input terminal 102 of ferroelectric logic NAND-gate 100. In addition, transmission gate 136 has a control terminal 128 and a complementary control terminal 130. Typically, control terminal 128 is coupled for receiving a clock signal CLK and a complementary control terminal 130 is coupled for receiving a complementary clock signal CLKB.

An input of transmission gate 138 serves as data input terminal 124 of clocked ferroelectric logic NAND-gate 140 and an output terminal of transmission gate 138 is connected to logic input terminal 104 of ferroelectric logic NAND-gate 100. In addition, transmission gate 138 has a control terminal 132 and a complementary control terminal 134. Typically, control terminal 132 is coupled for receiving a clock signal CLK and a complementary control terminal 134 is coupled for receiving a complementary clock signal CLKB.

A clocked ferroelectric logic NAND structure has been described having two transmission gates, two serially connected N-channel ferroelectric transistors and two parallel connected P-channel ferroelectric transistors. It should be noted that a clocked ferroelectric logic NOR structure has two transmission gates, two serially connected P-channel ferroelectric transistors and two parallel connected N-channel ferroelectric transistors.

In operation, when a logic signal having a logic one value is received at control terminal 128 and a signal having a logic zero value is received at complementary control terminal 130, transmission gate 136 is "on" and a signal received at data input terminal 122 is transferred to logic input terminal 102. When a signal having a logic one value is received at control terminal 132 and a signal having a logic zero value is received at complementary control terminal 134, transmission gate 138 is "on" and a signal received at data input terminal 124 is transferred to logic input terminal 104 of ferroelectric logic NAND-gate 100. An output signal at logic output terminal 106 has a value in accordance with the signals received at data input terminals 122 and 124 when both transmission gates 136 and 138 are "on". When transmission gate 136 is not in the "on" condition, the signal at logic output terminal 106 responds to the polarization or depolarization state for ferroelectric transistors 108 and 112 (FIG. 8). When transmission gate 138 is not in the "on" condition, the signal at logic output terminal 106 responds to the polarization or depolarization state for ferroelectric transistors 110 and 114 (FIG. 8). It should be noted that transmission gates 136 and 138 may both receive the signal CLK at control terminals 128 and 132 and the signal CLKB at complementary control terminals 130 and 134. However, transmission gate 136 may receive inputs that are separate from those received by transmission gate 138. For instance, transmission gate 138 may receive the signals CLK1 AND CLK1B.

Figure 10:
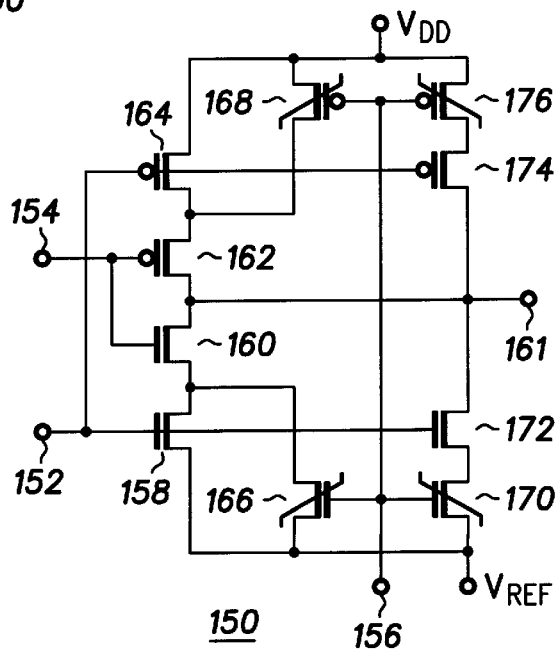
FIG. 10 is a schematic diagram of a programmable logic function in accordance with a ninth embodiment of the present invention.

FIG. 10 is a schematic diagram of a programmable logic function 150 in accordance with a ninth embodiment of the present invention. Programmable logic function 150 has an input terminal 152, an input terminal 154, a programming terminal 156, and a output terminal 161. Commonly connected gate terminals of N-channel MOSFETs 158 and 172 and P-channel MOSFETs 164 and 174 form input terminal 152. Commonly connected gate terminals of N-channel MOSFET 160 and P-channel MOSFET 162 form input terminal 154. N-channel MOSFETs 160 and 172 and P-channel MOSFETs 162 and 174 have commonly connected drain terminals that serve as output terminal 161 of programmable logic function 150. Commonly connected source terminals of N-channel MOSFET 158 and N-channel ferroelectric transistors 166 and 170 serve as a bias terminal and are connected to a first source of operating potential such as, for example, a voltage $V_{REF}$. By way of example, voltage $V_{REF}$ is a ground potential. A source terminal of N-channel MOSFET 160 is commonly connected to the drain terminals of N-channel MOSFET 158 and N-channel ferroelectric transistor 166. A source terminal of P-channel MOSFET 162 is connected to the drain terminals of P-channel MOSFET 164 and P-channel ferroelectric transistor 168. The source terminals of P-channel MOSFET 164 and P-channel ferroelectric transistors 168 and 176 are commonly connected and serve as a bias terminal to a second source of operating potential such as, for example, a supply voltage $V_{DD}$. A drain of P-channel ferroelectric transistor 176 is connected to a source of P-channel MOSFET 174. A drain of N-channel ferroelectric transistor 170 is connected to a source of N-channel MOSFET 172.

In operation, programmable logic function 150 is a 2-input NAND-gate function when a signal received at programming terminal 156 has a low programming value. Programmable logic function 150 is a 2-input NOR-gate function when a signal received at programming terminal 156 has a high programming value. N-channel ferroelectric transistors 166 and 170 and P-channel ferroelectric transistors 168 and 176 are "programmed" for either a NAND function or a NOR function by the voltage value received at programming terminal 156.

A signal having a low programming value is received at programming terminal 156. The signal is a depolarizing voltage for N-channel ferroelectric transistors 166 and 170 and a polarizing voltage for P-channel ferroelectric transistors 168 and 176. A signal having a high programming value received at programming terminal 156 is a polarizing voltage of N-channel ferroelectric transistors 166 and 170 and a depolarizing voltage of P-channel ferroelectric transistors 168 and 176. Polarized ferroelectric transistors are considered to be in the "on-state" or conductive state and depolarized ferroelectric transistors are considered to be in the "off-state" or nonconductive state.

When programmable logic function 150 is programmed as a 2-input NAND-gate function, output terminal 161 has a logic zero value when both input terminal 152 and input terminal 154 receive signals having logic one values. When either input terminals 152 or 154 receive signals having logic zero values, output terminal 161 has a logic one value.

When programmable logic function 150 is programmed as a 2-input NOR-gate function, output terminal 161 has a logic one value when both input terminals 152 and 154 receive signals having logic zero values. When either input terminals 152 or 154 receive signals having logic one values, output terminal 161 has a logic zero value.

By now it should be appreciated that a ferroelectric transistor used as a ferroelectric logic gate provides a retention of data-states or program-states. Input data to a gate terminal of a ferroelectric transistor in a logic gate structure causes data-states that maintain the logic value of the data when the data is removed. By maintaining data-states, the ferroelectric transistors provide a latch function and thereby minimize the device count in performing the latched function. Input data to the gate terminals of ferroelectric transistors in a logic gate structure causes program-states that maintain a logic function performed by the programmed logic structure.

We claim:

1. A ferroelectric transmission gate, comprising:
  an N-channel ferroelectric transistor having a control electrode, a first current carrying electrode, and a second current carrying electrode, wherein the control electrode is coupled for receiving a control input signal; and
  a P-channel ferroelectric transistor having a control electrode, a first current carrying electrode, and a second current carrying electrode, wherein the control electrode is coupled for receiving a complementary control input signal, the first current carrying electrode is coupled to the first current carrying electrode of the N-channel ferroelectric transistor and serves as an input terminal, and the second current carrying electrode is coupled to the second current carrying electrode of the N-channel ferroelectric transistor and serves as an output terminal.

2. A logic structure, comprising:
  a first transistor of a first type having a control electrode, a first current carrying electrode, and a second current carrying electrode;
  a first ferroelectric transistor of the first type having a control electrode, a first current carrying electrode, and a second current carrying electrode, wherein the first current carrying electrode is coupled to the second current carrying electrode of the first transistor of the first type;
  a first ferroelectric transistor of a second type having a control electrode, a first current carrying electrode, and a second current carrying electrode, wherein the second current carrying electrode is coupled to the second current carrying electrode of the first ferroelectric transistor of the first type to form an output terminal, and the control electrode is coupled to the control electrode of the first ferroelectric transistor of the first type to form an input terminal; and
  a second transistor of the second type having a control electrode, a first current carrying electrode, and a second current carrying electrode, wherein the second current carrying electrode is coupled to the first current carrying electrode of the first ferroelectric transistor of the second type.

3. The logic structure of claim 2, wherein the first transistor of the first type is a P-channel Metal Oxide Semiconductor Field Effect Transistor (MOSFET) and the second transistor of the second type is an N-channel MOSFET, the control electrode of the first transistor of the first type and the control electrode of the second transistor of the second type are coupled to receive complementary signals.

4. The logic structure of claim 2, wherein the first transistor of the first type is a first P-channel ferroelectric transistor and the second transistor of a second type is a second N-channel ferroelectric transistor, the control electrode of the first transistor of the first type and the control electrode of the second transistor of the second type are coupled to the input terminal.

5. The logic structure of claim 4, further comprising:
  a P-channel MOSFET having a gate terminal, a drain terminal, and a source terminal, wherein the source terminal is coupled to the first current carrying electrode of the first P-channel ferroelectric transistor and the drain terminal is coupled to the second current carrying electrode of the first P-channel ferroelectric transistor; and
  an N-channel MOSFET having a gate terminal, a drain terminal, and a source terminal, wherein the gate terminal is coupled to the gate terminal of the P-channel MOSFET and forms another input terminal, the source terminal is coupled to the first current carrying electrode of the second N-channel ferroelectric transistor and the drain terminal is coupled to the second current carrying electrode of the second N-channel ferroelectric transistor.

6. A ferroelectric logic gate, comprising:
  a first ferroelectric transistor of a first type, having a control electrode, a first current carrying electrode, and a second current carrying electrode;
  a second ferroelectric transistor of the first type having a control electrode, a first current carrying electrode, and a second current carrying electrode, wherein the first current carrying electrode is coupled to the first current carrying electrode of the first ferroelectric transistor of the first type, and the second current carrying electrode is coupled to the second current carrying electrode of the first ferroelectric transistor of the first type to form a logic gate output;
  a first ferroelectric transistor of a second type, having a control electrode, a first current carrying electrode, and a second current carrying electrode, wherein the control electrode is coupled to the control electrode of the second ferroelectric transistor of the first type and forms a first logic input, and the second current carrying electrode is coupled to the second current carrying electrode of the first ferroelectric transistor of the first type; and
  a second ferroelectric transistor of the second type having a control electrode, a first current carrying electrode, and a second current carrying electrode, wherein the second current carrying electrode is coupled to the first current carrying electrode of the first ferroelectric transistor of the second type, and the control electrode is coupled to the control electrode of the first ferroelectric transistor of the first type and forms a second logic input.

7. The ferroelectric logic gate of claim 6, further comprising:
  a first transmission gate having an input, a control input, and an output coupled to the first logic input; and
  a second transmission gate having an input, a control input, and an output coupled to the second logic input.

8. The ferroelectric logic gate of claim 7, wherein the control input of the first transmission gate is coupled to receive a first clock input signal and the control input of the second transmission gate is coupled to receive a second clock input signal.

9. A programmable logic function, comprising:

a first ferroelectric transistor of a first type having a control electrode, a first current carrying electrode, and a second current carrying electrode;

a second ferroelectric transistor of the first type having a control electrode, a first current carrying electrode, and a second current carrying electrode, wherein the control electrode is coupled to the control electrode of the first ferroelectric transistor of the first type and forms a programming input terminal, the first current carrying electrode is coupled to the first current carrying electrode of the first ferroelectric transistor of the first type;

a first transistor of the first type having a control electrode, a first current carrying electrode, and a second current carrying electrode, wherein the first current carrying electrode is coupled to the first current carrying electrode of the first ferroelectric transistor of the first type;

a second transistor of the first type having a control electrode, a first current carrying electrode, and a second current carrying electrode, wherein the control electrode is coupled to the control electrode of the first transistor of the first type and serves as a first logic input, and the first current carrying electrode is coupled to the second current carrying electrode of the first ferroelectric transistor of the first type; and a third transistor of the first type having a control electrode, a first current carrying electrode, and a second current carrying electrode, wherein the control electrode is coupled for receiving a second logic input, the first current carrying electrode is coupled to the second current carrying electrode of the first transistor of the first type and to the second current carrying electrode of the second ferroelectric transistor of the first type, and the second current carrying electrode is coupled to the second current carrying electrode of the second transistor of the first type and forms a node that serves as a logic output.

10. The programmable logic function of claim 9, further comprising:

a first ferroelectric transistor of a second type having a control electrode, a first current carrying electrode, and a second current carrying electrode;

a second ferroelectric transistor of the second type having a control electrode, a first current carrying electrode, and a second current carrying electrode, wherein the control electrode is coupled to the control electrode of the first ferroelectric transistor of the second type and to the programming input terminal, the first current carrying electrode is coupled to the first current carrying electrode of the first ferroelectric transistor of the second type;

a first transistor of the second type having a control electrode, a first current carrying electrode, and a second current carrying electrode, wherein the first current carrying electrode is coupled to the first current carrying electrode of the first ferroelectric transistor of the second type;

a second transistor of the second type having a control electrode, a first current carrying electrode, and a second current carrying electrode, wherein the control electrode is coupled to the control electrode of the first transistor of the second type and to the first logic input, and the first current carrying electrode is coupled to the second current carrying electrode of the first ferroelectric transistor of the second type; and a third transistor of the second type having a control electrode, a first current carrying electrode, and a second current carrying electrode, wherein the control electrode is coupled to the second logic input, the first current carrying electrode is coupled to the second current carrying electrode of the first transistor of the second type and to the second current carrying electrode of the second ferroelectric transistor of the second type, and the second current carrying electrode is coupled to the second current carrying electrode of the second transistor of the second type and to the logic output.

11. The programmable logic function of claim 10, wherein the first type is P-channel and the second type is N-channel.

* * * * *